United States Patent [19]
Haulin

[11] Patent Number: 5,602,988
[45] Date of Patent: Feb. 11, 1997

[54] FAULT TOLERANT QUEUE SYSTEM

[75] Inventor: Tord L. Haulin, Uppsala, Sweden

[73] Assignee: Telefonaktiebolaget LM Ericsson, Stockholm, Sweden

[21] Appl. No.: 339,672

[22] Filed: Nov. 14, 1994

[30] Foreign Application Priority Data

Nov. 26, 1993 [SE] Sweden .................. 93039329

[51] Int. Cl.$^6$ ............................ G06F 11/00
[52] U.S. Cl. ........................ 395/183.18; 395/427
[58] Field of Search .................. 395/427, 437, 395/185.06, 185.07, 185.02, 183.18; 370/60, 60.1

[56] References Cited

U.S. PATENT DOCUMENTS

| | | | |
|---|---|---|---|
| 3,863,227 | 1/1975 | Sanabria | 340/172.5 |
| 4,049,956 | 9/1977 | Van Veen | 235/153 |
| 4,933,932 | 6/1990 | Quinquis et al. | 370/60 |
| 4,953,157 | 8/1990 | Franklin et al. | 370/60 |
| 5,014,266 | 5/1991 | Bales et al. | 370/60.1 |
| 5,016,248 | 5/1991 | Kudoh | 370/94.1 |
| 5,291,482 | 3/1994 | McHarg et al. | 370/60 |
| 5,388,238 | 2/1995 | McHarg et al. | 395/425 |
| 5,432,908 | 7/1995 | Heddes et al. | 395/250 |
| 5,485,453 | 1/1996 | Wahlman et al. | 370/16 |

OTHER PUBLICATIONS

R. Treuer et al., "Built–In Self–Diagnosis for Repairable Embedded RAMS", *IEEE Design & Test of Computers*, 1993, pp. 24–33.

C. H. Stapper et al., "Synergistic Fault–Tolerance for Memory Chips", *IEEE Transactions on Computers*, vol. 41, No. 9, Sep. 1992, pp. 1078–1087.

Ad J. Van De Goor, "Using March Tests to Test SRAMs", *IEEE Design & Test of Computers*, Mar. 1993, pp. 8–14.

"Technique for Defect Management in Computer Main Memory", *IBM Technical Disclosure Bulletin*, vol. 35, No. 1A, Jun. 1992, pp. 357–358.

Primary Examiner—Robert W. Beausoliel, Jr.
Assistant Examiner—Joseph E. Palys
Attorney, Agent, or Firm—Burns, Doane, Swecker & Mathis, L.L.P.

[57] ABSTRACT

A fault tolerant queue system for buffering data in a packet switch with a common buffer memory for one or more output ports from the switch uses a number of pointers identifying storing positions in the buffer memory. Multiple copies of the same pointer are handled in a controlled way by using a multiple pointer list where the number of copies included in the system of respective pointers are recorded. A maintenance function checks that the number of copies of a pointer agrees with the value recorded in the multiple pointer list for the respective pointer. The maintenance function cyclically checks all pointers and appurtenant buffer positions, one at the time. This is preceded by an initiation procedure during which the pointer is taken out of operation by filtering out the pointer from the flow of pointers which from output queue lists for queueing pointers in queue to the output ports of the memory are returned to the idle list, until the queue system has been emptied of each copy of the pointer in question. Thereupon, the number of returned copies of the pointer in question is compared with the value in the multiple pointer list. The maintenance function can thereafter work in accordance with one or more operating modes for performing the cyclical control.

23 Claims, 5 Drawing Sheets

FAULT TOLERANT QUEUE SYSTEM

BACKGROUND

The present invention according to a first aspect relates to a queue system for selection of storing positions in a memory for performing write operations on these from an online maintained idle list of addresses to free storing positions in the memory. The queue system also calculates addresses for collecting data earlier stored in the memory.

In accordance with second and third aspects the invention relates to a queue system for buffering data in a packet switch with a common buffer memory for one or more ports of the switch. The system uses a number of pointers identifying storing positions in the buffer memory. The pointers are moved between different logical lists for indicating the operation to be performed on the data in the buffer position pointed to.

The invention furthermore relates to methods for testing storing positions and pointers, respectively, in connection with queue systems of the kind indicated above.

When memories are used in computers and other equipment, address calculation decides the physical positions to be used for storing of a certain data. Most simply direct addressing, decision or calculations of which address to be used is performed at compiling of a program, or in connection with hardware design for devices having fixed programs. Indirect addressing and linked lists are examples of more flexible addressing methods. Here the address information is stored in other address positions or in counters, etc. The address calculation is thus not fixed but varies during execution for adaption to amount and format of the stored data.

Simple FIFO memories with direct addressing most often are realized with counters for incrementing write and read addresses, or in their most simple form are realized with fixed addresses in shift registers. In connection with dynamic indirect addressing address pointers are used, which are also stored in memories. At system start these pointers are initialized so as to obtain a valid set of pointers for the system to work with. The function of the system is then dependent on this pointer initialization being not corrupted during operation. Bit errors in a pointer value results in a lasting malfunction in the system. For systems being in continuous operation with high demands on reliability this is a problem.

Great semiconductor memories are traditionally equipped with redundance for improving the yield of the manufacture. By redundancy is here meant rows and columns of spare circuits, which may be connected into circuit to replace ordinary circuits. This is obtained by fusing fuses or by other means for permanently reconfiguring the circuit in the factory.

Testing is performed for determining circuits requiring reparation. If manufacturing errors occur and are such that they can be repaired by connection into circuit of spare circuits, the type of manufacturing error is determined and the repair is performed.

For semiconductor memories without redundancy, mapping between address and physical position in the memory is determined while designing the memory. For semiconductor memories with redundancy this mapping is partly set during the design and is completed during manufacture when erroneous memory positions shall be repaired.

In the case of disc memories a testing procedure is used before taking the disc into operation, during a formatting operation for determining the sections on the disc which may be used. The aim is to be able to use a disc with bad sections. The error hypothesis used is that certain positions on the disc may be bad due to the manufacture being not perfect. The dividing in good and bad sectors may be performed during the formatting process and is assumed not to need to be changed. The risk for disc addressing errors need not be taken into consideration during the formatting procedure.

In certain systems error correcting codes (ECC=Error Correcting Codes) are used for obtaining error tolerance against bit errors during operation. These errors occurring during operation may be soft or hard, i.e. temporary disturbances or fixed errors. The number of bits able to be corrected in each word is delimited. The code most often used may correct single bit errors and detect double bit errors. Quite recently it has been shown that a combination of error correcting codes and spare rows provides an error tolerance system which has a very high degree repairability of manufacturing errors in semiconductor memories, cf. IEEE transactions on computers, vol. 41 #9 September 1992, pp 1078–1087.

Repair of devices before they leave manufacture requires testing apparatus and equipment for fuse programming (a lasting change of connections in an electric circuit for influencing its function—also called fuse or antifuse), on the manufacturing line in the factory, and a manufacturing process including fuse components. This implies increased costs due to a prolongation of the manufacturing cycle. The degree of success with respect to the repair operations is limited by the fact that they are based on the use of spare rows and columns, and by the inflexibility with respect to the handling of sporadic single errors.

Use of error correcting codes takes care of isolated single errors. For full efficiency there is, however, required a combination with some sort of system with redundant rows. According to the state of the art this implies fuse programming and testing before the circuits leave the manufactory.

U.S. Pat. No. 4,049,956 provides an example of the state of the art as regards error detection during operation and describes supervision of a memory working in a time multiplexing mode. Incoming data words are stored temporarily in the respective steps of a multiple step memory and are read out for further revision. The testing is performed without taking the memory out of normal operation. The memory consists of a number of n steps which are periodically addressed in a repeated scanning cycle of n time slots in which binary words are written into and read out from the respective steps. Words written into a memory step are read out in the immediately following cycle. Malfunctions are detected by means of parity checks.

U.S. Pat. No. 3,863,227 describes the selection and testing of each one of individual electronic control elements used for accessing the different core elements in a core memory when the memory is on-line. There is thus the question of on-line test of a memory system, but not of the memory storing elements included in the memory. No use of parity tests is described.

U.S. Pat. No. 5,016,248 describes a queueing system for packet transfer without mentioning initialization or maintenance.

SUMMARY

A first object of the present invention is to provide error tolerance by a continuous maintenance of the pointer handling in a queue system with dynamic indirect addressing so that the system always has the ability of resetting a correct set of pointers independently of the state in which the system has ended.

A second object is to attain error tolerance against errors in memories which can occur during operation of the system.

A third object of the invention is to improve the yield at manufacture of great semiconductor memories by organizing and using redundant circuit in a new way. By using error tolerance, memories with small manufacturing errors may operate in a correct manner and need not be rejected. By suitable setting of the rejection level during the testing procedure so as to maintain spare capacity, the memory handling system may also recover from errors occurring during operation.

According to the invention the above mentioned objects are obtained entirely, or partly in the following way.

In a queue system according to the first aspect indicated by way of introduction the storing positions are exposed to a testing procedure which is performed periodically on each storing position in idle cycles during operation of the system. The result of the procedure is used for maintenance of the idle list. The addresses selected for test are released from system use as controlled by the system.

In one embodiment the test of a storing position is performed after awaitance of it having been released from use by the system, and return to system use is performed only if the storing position stands the test.

In another embodiment addresses to the storing positions are released by copying the contents of the storing position to be tested to a free and error free storing position. Thereupon the address calculation is redirected for use by the new storing position. Finally the tested storing position is returned to system use only if it stands the test.

In a further embodiment storing positions having not standed the test are retested at occasions when the whole memory block containing the storing position in question is released from use in the system.

In still a further embodiment memory testing logic for performing the testing of a determined storing position operates in a first mode in which all addresses are tested in an off-line test controlled by the testing logic, during which counting is performed of the number of storing positions with correctable errors and in which existing not correctable errors are indicated, and in a second mode online, during which the memory testing logic only checks data to the memory position being tested, and other storing positions are brought to operate with data during normal operation as address controlled by the system.

In a queue system according to the second aspect indicated by way of introduction a maintenance function continuously secures that the system includes one and only one pointer to each valid packet position in the buffer memory.

In a queue system according to the third aspect indicated by way of introduction copies of the same pointer are handled in a controlled way by using a multiple pointer list in which the number of copies included in the system of respective pointers are recorded, and in which a maintenance function checks that the number of copies of a pointer agrees with the value recorded in the multiple pointer list for the respective pointer.

In a first embodiment the following logical lists for the respective pointer categories are used besides the multiple pointer list: an idle list for idle pointers, output queue lists for queued pointers in a queue to output ports, and a blocking list for blocked pointers. The maintenance function cyclically checks all pointers and appurtenant buffer positions, one at the time, preceded by an initiation procedure. During this procedure the pointer is taken out of operation by filtering out the pointer from the flow of pointers, which from the output queue lists are returned to the idle list until the queue system has been emptied of each copy of the pointer in question, whereupon the number of returned copies of the pointer in question is compared with the value in the multiple pointer list.

In a first further development of this embodiment the maintenance function has a first operational mode which, after the initiation procedure, and activated by either the fact that more than a determined limit number of pointers have been found as a result of said initiation procedure, the respective number of copies of which does not agree with the value in the multiple pointer list for the pointer in question, or by an external signal, returns the pointers to the idle list, resets the value in the multiple pointer list to no multiple copies, and in the blocking list indicates no blocking of pointers.

In a second further development the maintenance function has a first operational mode which, after the initiation procedure, and activated by the fact that either more than a determined limit number of lost or multiple pointers have been found as a result of said initiation procedure, or by an external signal, returns a copy of each pointer to the idle list, and in the blocking list indicates no blocking of pointers.

The maintenance function may have only one further operational mode, i.e. a second mode. In that case this second operational mode is activated by the first maintenance mode having been run through for all pointers. Thereupon the initiation procedure is again performed on each pointer, one at a time, and a buffer memory test is queued with low priority on non-blocked memory positions identified by the pointer in question. All other non-blocked memory positions are exercised with system data during the test. The result of the memory test is used for returning the pointer to the idle list if the buffer memory test has given a correct result, but it is blocked from use in the system if the buffer memory test indicates malfunction of the area defined by the pointer. The blocked pointers are exposed to a second buffer memory testing of the same type as the first one conditioned by each testing data operation is maintained in the queue as long as system data is stored anywhere in the buffer memory segment including the positions which have been identified by blocked pointers. The result of the second test is used for returning the pointer to the idle list if the test has given a correct result, whereas blocked pointers are returned to the idle list first after having been accepted in a number of consecutive tests exceeding a second limit number.

In case the maintenance function has a number of different operational modes, it may have a second operational mode activated by the first mode having been run through for all pointers, whereupon the initiation procedure is again performed on the pointers. A simple write and read test is queued for execution on buffer memory positions identified by pointers the number of copies of which does not agree with the value in the multiple pointer list. The result of the write and read test is used for returning the pointer in question to the idle list if the test has given a correct result, but blocking it out from use in the system if the test indicates malfunction within the area identified by the pointer in question.

A third operational mode is activated by the second mode having been run through for all pointers, whereupon the initiation procedure is once again executed on the non-blocked pointers. A buffer memory test for detecting types of malfunctions having not been detected by the simple write and read test in the second operational mode is queued for execution on the buffer memory positions which have been identified by the initiated pointer, said memory positions being exercised with testing data, whereas all other, non-blocked buffer memory positions are exercised with system data during the test for each blocked pointer. The result of the test is used for returning the pointer to the idle list if the buffer memory test has given a correct result, but blocking it out from use in the system if the buffer memory test indicates malfunction in the area identified by the pointer.

A fourth operational mode is activated by the third mode having been run through for all pointers, whereupon also the earlier blocked pointers are accepted for testing by performing said initiation procedure cyclically for all pointers, one at a time. A buffer memory test of the same kind as in the third mode is applied on non-blocked pointers whereas earlier blocked pointers are exposed to the same type of buffer memory testing conditioned by each testing data operation being maintained in queue as long as system data is stored anywhere in the buffer memory segment containing the positions having been identified by the earlier blocked pointer in question. The result of the testing is used in the same way as in the third mode for non-blocked pointers and non accepted tests of earlier blocked pointers, whereas earlier blocked pointers are returned to the idle list first after having been accepted in a number of consecutive tests defined by a limit number.

The memory handling system according to the invention provides a dynamic tolerance against manufacturing errors when the system is in operation. Testing and repair by reconfiguration in the factory is not required. Testing is performed after completed manufacture for determining whether the memory has storing capacity enough or not for the intended application.

BRIEF DESCRIPTION OF THE DRAWINGS

The invention will now be described more closely below with reference to an embodiment shown on the attached drawing, in which FIG. 1 very schematically illustrates a queue system according to one of the aspects of the invention, FIG. 2 partly in block form illustrates an embodiment of a packet switch, in which the different aspects of the invention are used.

DETAILED DESCRIPTION

Figure 1:
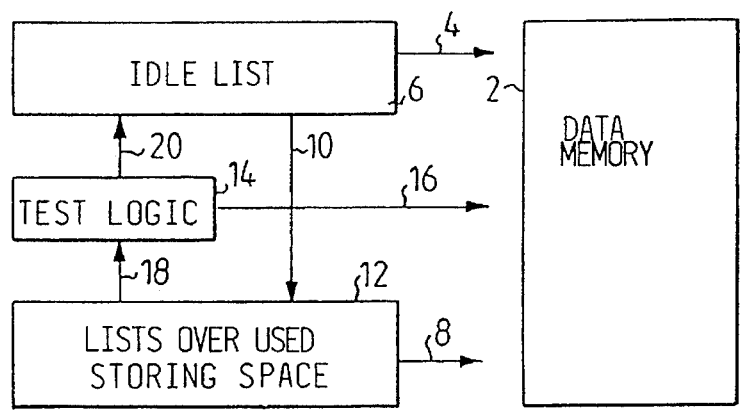

FIG. 1 very schematically illustrates a queue system for selecting storing positions in a data memory 2 for performing write operations, arrow 4, on these from an on-line maintained idle list 6 of addresses to free storing positions in the memory 2, and calculation of addresses for collecting, arrow 8, data earlier stored in the memory 2. The last mentioned addresses are transferred, arrow 10, to lists 12 over used storing space in the memory 2.

According to a first aspect of the invention the memory positions of the memory by means of a testing logic 14 are subjected to a testing procedure which is performed periodically, arrow 16, on each storing position during idle cycles during operation of the system. The positions to be tested are selected, arrow 18, by means of the addresses included in the lists 12, the selected positions being released from system use controlled by the system. The result of the test is used for maintenance, arrow 20, of the idle list 6.

The testing of a storing position may be performed after awaitance of it being released from system use. Alternatively addresses to storing positions to be tested may be released by copying the contents of such a storing position to be tested into a free and error free new storing position. The address calculation is thereupon redirected for use of this new storing position.

In both cases a tested storing position is finally returned to system use, i.e. to the idle list 6, only if it can stand the testing. Storing positions not standing the testing are retested at occasions when all the memory block including the storing position in question is released from use in the system.

The memory testing logic 14 for performing the testing of a given storage position may preferably operate in two modes.

In the first mode all addresses are tested in an off-line test controlled by the logic, during which counting is performed of the number of storing positions with correctable errors, and in which existing not correctable errors are indicated.

During this component testing a complete memory test is performed with e.g. so-called "march patterns", cf. e.g. "Using March Tests to Test SRAMS", AD J van de Goor, IEEE Design & Test of Computers, March 93, vol 10, no 1, and "Built in Self Diagnosis for Repairable Embedded RAM:S", Robert Trenter, et al, IEEE Design a Tests of Computers, June 93, vol 10, no 2. This is done for eliminating not operable circuits. Since the queue system according to the invention offers a certain amount of error tolerance, also circuits with erroneous storing positions may be classed as correct. Therefore the number of errors are recorded during the testing. If the number of errors is lower than the set rejection threshold the component is accepted.

In the second mode, acting on-line, the logic 20 only supervises data to the memory position being tested, and other storing positions are forced to operate with data during normal operation as address controlled by the system.

An embodiment of the invention will now be described more in detail. In one type of packet switch, and with reference to FIG. 2, an arriving packet is written, after analysis of the contents in the head of the packet in an analyzing function 30, into a storing position in a buffer memory 32, common to the arriving packets. The buffer memory 32 is shown schematically with an arriving packet flow 34 and a number of output channels 36.1 . . . 36.n for packet flows leaving the switch. The flow of data to the analysis function 30 for enabling this function has been designated 34'.

The writing is performed guided by an address list 38 containing address pointers pointing to corresponding idle storing positions in the buffer memory 32. This address list is also shortly called "idle list" below. More particularly, the analysis function 30 with a signal, according to arrow 39, instructs the idle list 38, on the one hand, to provide a pointer for the packet in question and, on the other hand, after writing, signalled according to arrow 40 from the idle list 38 to the buffer-memory 32, of the packet into the buffer memory guided by the pointer, to transfer the pointer to a pointer queue system containing a number of FIFO pointer queues 44, one for each output 36.

More particularly, the pointer is thus moved according to arrow 42 from the idle list 38 to a FIFO pointer queue 44.n for a switch output 36.n which has been selected for the packet guided by the analysis of the contents of its head. The selection of pointer queue is performed by a control signal 45 from the analysis function 30 to the pointer queue in question.

The head of an arriving packet may contain several destination addresses, i.e. the contents of the packet may be sent to several switch outputs. In this case the pointer is copied to the selected storing position in the buffer memory 32 so as to obtain as many pointers as the number of switch outputs in question. Below also the denomination "multiple pointer" is used for a pointer in such a set of pointers which points to the same storing position in the buffer memory 32. These multiple pointers are guided to each one of the pointer queues for the outputs in question.

When a pointer, i.e. a single pointer or a multiple pointer, has appeared as the first one in its FIFO queue 44.n, the data packet pointed to by the pointer is read, according to arrow 46.n and guided by the pointer, from its storing position in the buffer memory 32 to the output 36.n in question.

Thereafter the pointer is redirected according to arrows 48 and 50 to the idle list 38 via a maintenance function 52, to be described more closely below, which supervises pointers to be returned to the idle list 38. More particularly, the pointer is moved to the idle list if it is not selected for testing by the maintenance function 52.

In the maintenance function 52 copies of the same pointer are handled in a controlled way. More particularly, this is performed by using a multiple pointer list 56 included in the maintenance function 52 in which the number of copies of the respective pointer included in the system are recorded. The maintenance function 52 also checks that the number of copies of a pointer agrees with the value recorded in the multiple pointer list 56 for the respective pointer.

In a more detailed description below of embodiments of the invention the denomination x is used for a pointer being tested, where x belongs to the set of all pointers. Correspondingly, the buffer memory position in the buffer memory 32 pointed to by the pointer x is designated B(x).

The maintenance function 52 in a way to be described more closely below, performs testing of buffer memory positions B(x). For this purpose the pointer x is transferred to a testing logic 58 for the buffer memory 32 according to the arrow 60'. The result of the test operation on the buffer memory position B(x) is signalled from the test logic 58 to the maintenance function 52 according to the arrow 60".

It will likewise appear more closely from the following description that if this testing indicates malfunction of a memory position the corresponding pointer will be blocked from use in the system and is supplied to a blocking list 62 likewise included in the maintenance function 52. The lists for multiple and blocked pointers may also be combined to a single list.

More particularly, the maintenance function 52 cyclically checks all pointers and appurtenant buffer positions, one at a time, preceded by an initiation procedure. With "all" pointers is here meant all pointers which shall exist in the system, i.e. pointers included in the idle list 38, in the output queues 44, in the multiple pointer list 56 and in the blocking list 62. During the initiation procedure each pointer value, one at a time, is taken out of operation for checking, on the one hand, that the handling of pointers of the queue system 38, 44 is correct, and, on the other hand, for checking the data storing area B(x) in the buffer memory 32, identified by the pointer in question.

During the initiation procedure the queue system 38, 44 is emptied of the pointer under test and of all copies thereof, if any, whereupon a check is made that the number of found copies is equal to the value in the multiple pointer list 56 for the pointer under test.

The maintenance function 52 can thereafter operate according to one or several operating modes. Irrespective of the alternative prevailing, the initiation procedure is the first step of each such operational mode.

Figure 3:
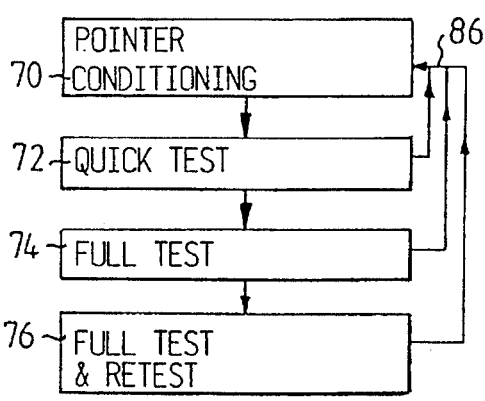
FIG. 3 shows a flow diagram of main operation modes included in a maintenance function for testing address pointers and buffer memory positions in the packet switch according to FIG. 2, and FIGS. 4–7 show flow diagrams for the respective modes of FIG. 3.

With reference to. FIG. 3 and in one embodiment of the case that there are several operational modes, there may be four levels 70, 72, 74 and 76 of the maintenance function 52. The lowest level 70 is denominated "Pointer conditioning" and is only directed to the circulation of pointers. The other three ones are extended with different read/write tests of the buffer memory 32.

As has been mentioned, the queue system 38, 44 is emptied of all copies, if any, of the pointer x during the initiation procedure. In non real-time systems this may be obtained in several different ways. In real-time systems one is usually reduced to working only with pointers being returned to the idle list 38.

For emptying a real-time queue system of the kind described above of the pointer x, the idle list 38 must first be emptied of all copies, if any, thereof. This is performed by filtering out the pointer x from the flow 48 of returned pointers, step 78 in FIGS. 4–7, so as to prevent it from being written into the idle list 38. More particularly this filtering is enabled in that the maintenance function 52 in accordance with the arrow 78' emits a signal to the idle list 38 to put an indicator for the pointer being the last one in the idle list for the moment. By means of a signal 78" the maintenance function 52 thereafter obtains information that the indicator has reached the most forward position in the idle list 38. When all pointers that existed in the idle list 38 at the beginning of the filtering step have been fed to output queues 44, the idle list 38 is emptied of all pointers x for certain.

Thereafter the output queues 44 must be emptied of copies, if any, of the pointer x. This emptying is enabled, more particularly, by the maintenance function 52 emitting, according to the arrow 79', a signal to the output queues 44 to set an indicator for the pointer being last in the respective output queue for the time being. With a signal according to the arrow 79" the maintenance function 52 thereafter obtains information from the output queues that the pointers thus indicated have ended first in the respective queue. The maintenance function 52 thus awaits, while continuously filtering out pointers x from the flow 48 of returned pointers, that the pointers which were located last in the output queues 44 at the time when the emptying of the idle list 38 had ended, shall end first in the queue. When the slowest queue has fulfilled this criterion, the system is emptied of the pointer x.

Figure 4:
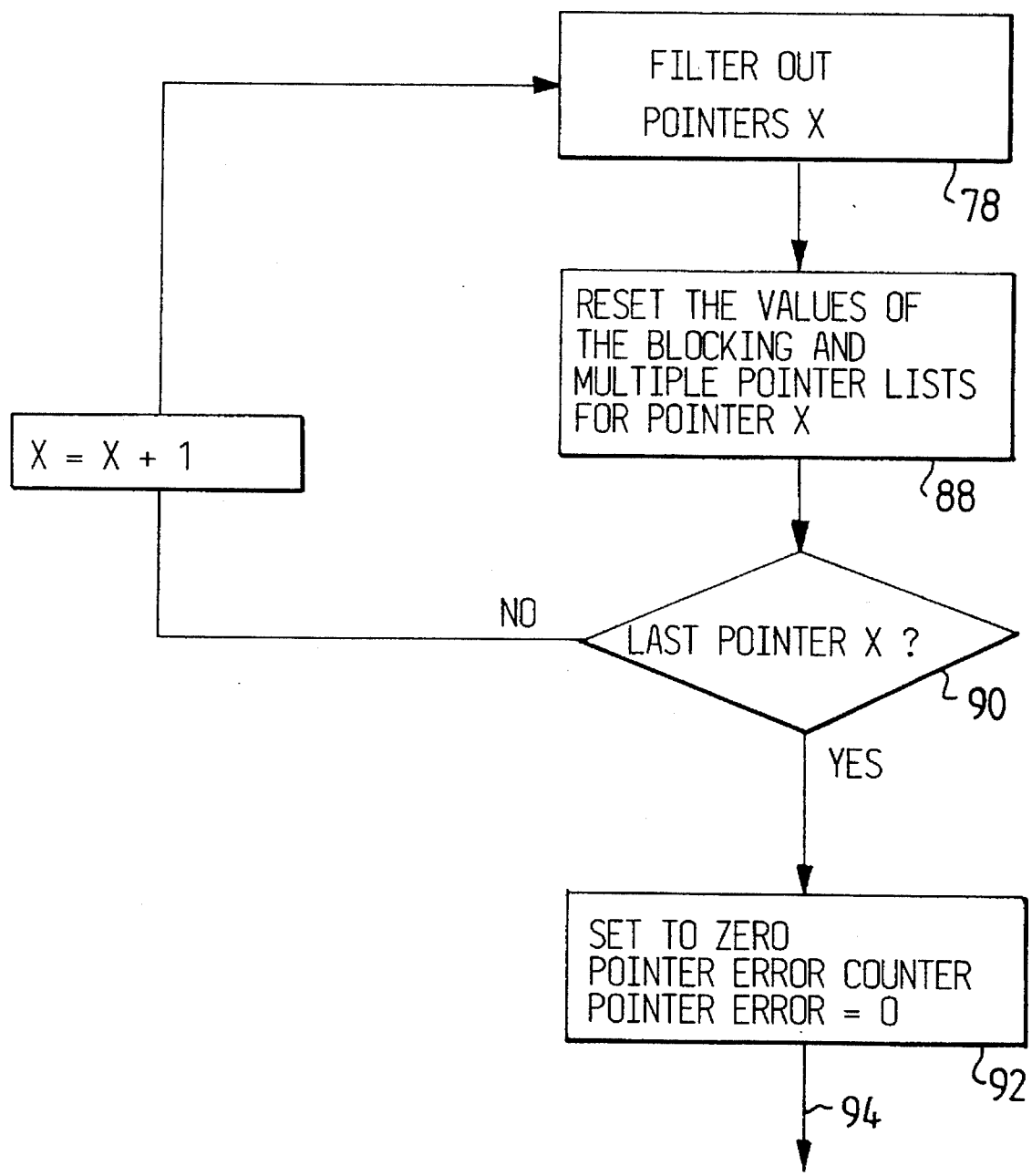
Figure 5:
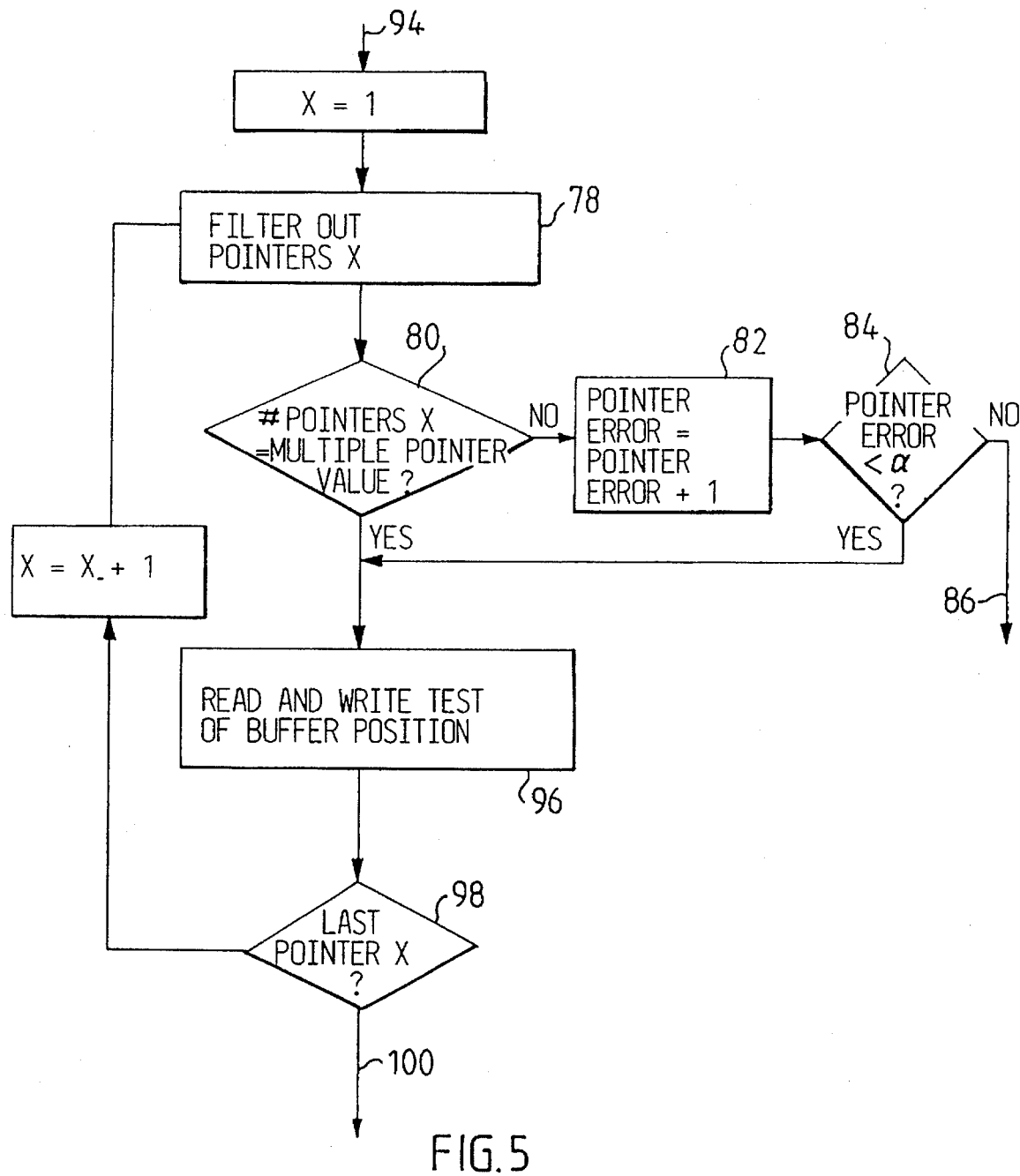
Figure 6:
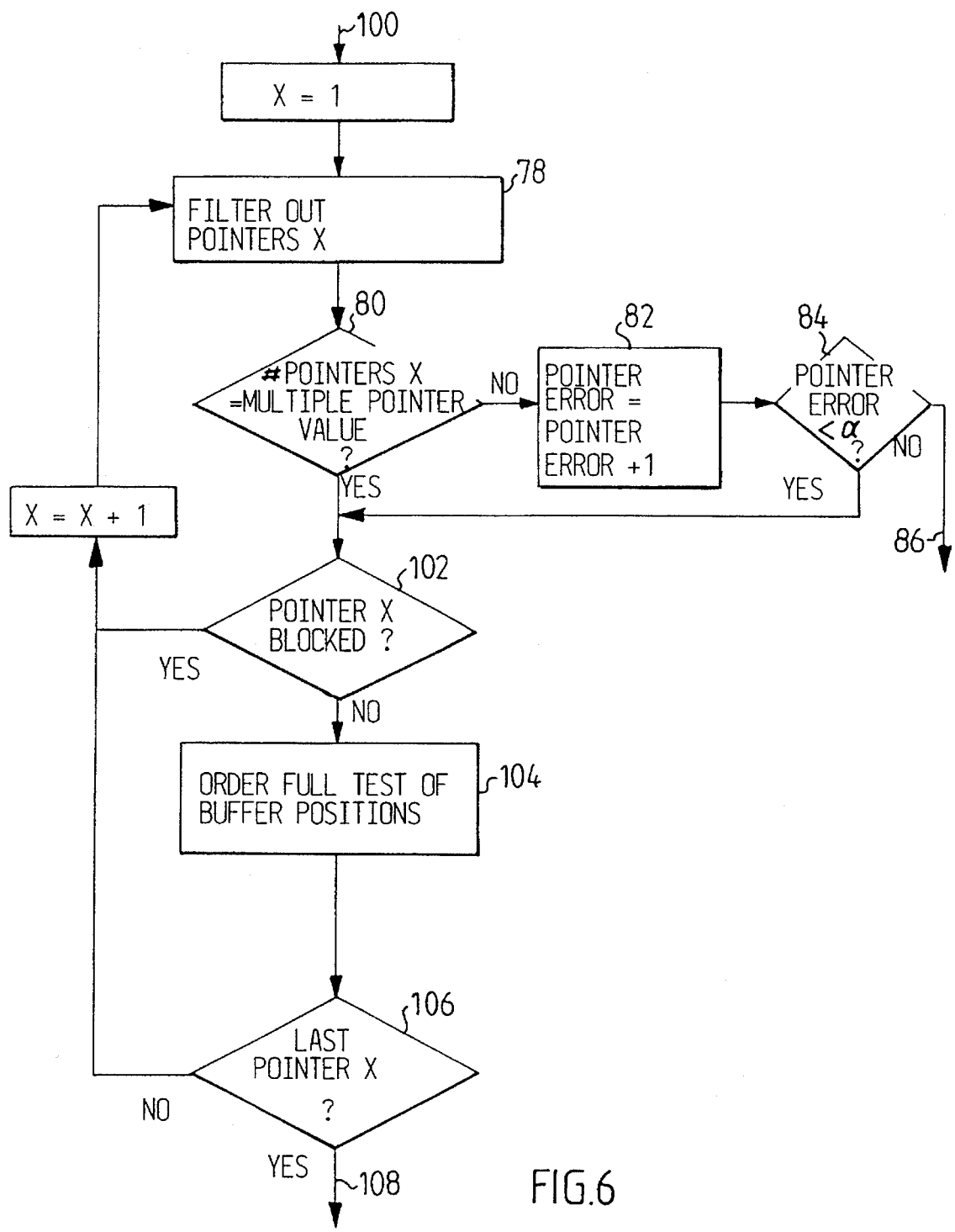
Figure 7:
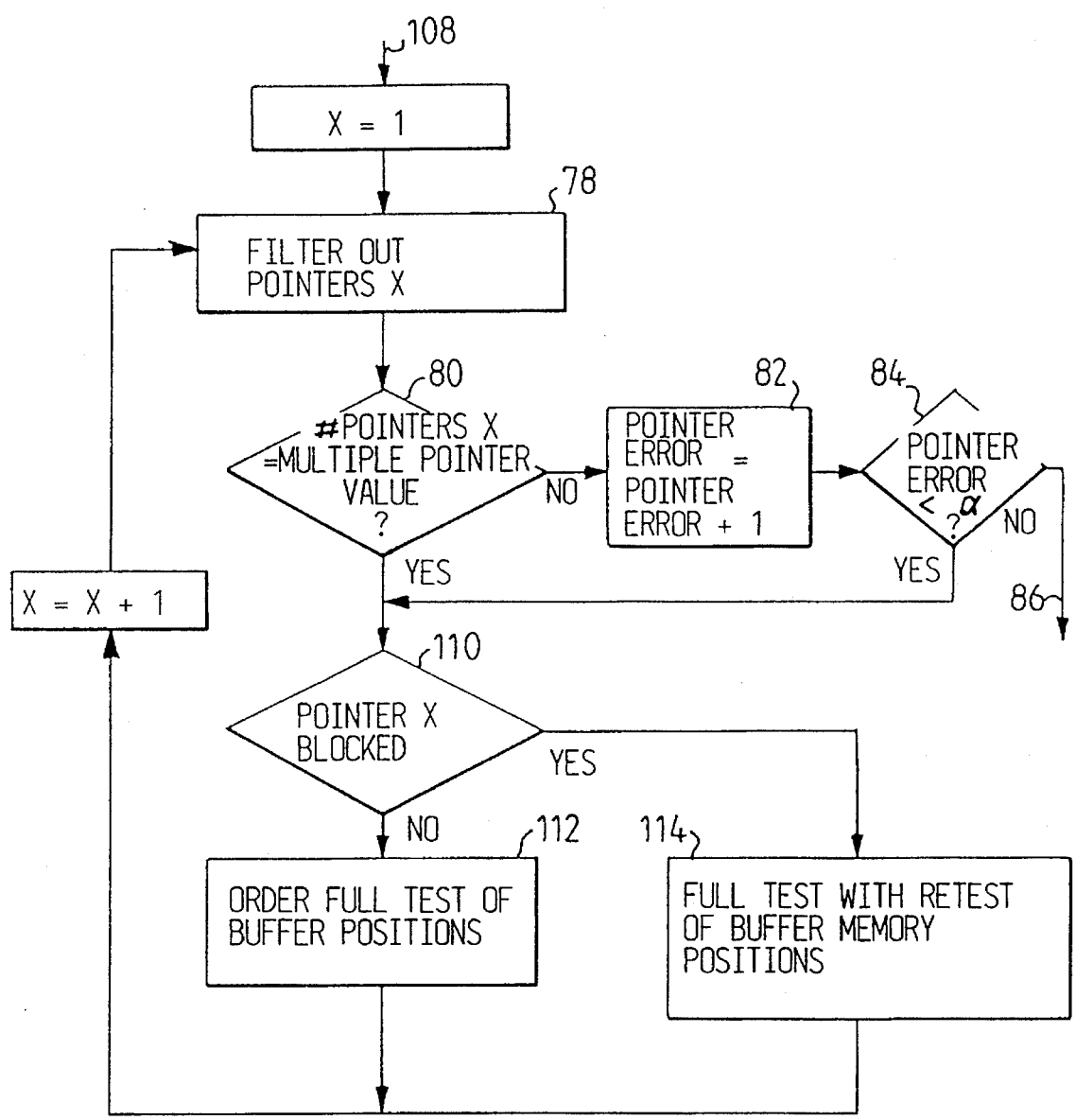

Thereafter, in step 80 in FIGS. 5–7, a check is made with respect to whether the number of returned pointers agrees with the value for the pointer x in the multiple pointer list 56. If this is not the case a pointer error signal is generated. This error signal ends in somewhat different measures depending on the maintenance mode being executed. In all modes except the mode "Pointer conditioning" the pointer value is blocked and an error counter, not shown, is incremented, step 82 in FIGS. 5–7. If more than a number of $\alpha$ errors are found, step 84 in FIGS. 5–7, the current maintenance mode is stopped, the error counter is set to zero and a jump is performed to the mode "Pointer conditioning", arrow 86 in FIGS. 5–7. α is the desired degree of tolerance to the error in the multiple pointer list 56. In the mode "Pointer conditioning" the pointer error signal does not end in any measure, cf. FIG. 4.

At start of the system a correct pointer set must be made available to the queue system as soon as possible. Therefore the procedure "Pointer conditioning" is initiated. This can be performed either as a result of a pointer error appearing in accordance with the above, or by activation by means of an external signal. By pointer error is here and further on intended, as has been described above, that the number of copies of a pointer returned during the initiation procedure does not agree with the number stated in the multiple pointer list for the pointer in question. As soon as a pointer has been checked it is introduced into the idle list 38 and can be used for queueing packets.

When all pointers have been conditioned the next maintenance level 72 is executed for all pointers, below also denominated "Quick test". Thereafter the maintenance function 52 passes into the maintenance level 74, below also denominated "Fulltest", whereupon execution is started of the maintenance level 76 "Fulltest with retest" which is the current operational state, which however can be interrupted if a pointer error occurs.

If several erroneous pointers (multiple or lost pointers) than α are detected, the maintenance function 52 will always, as has likewise been described above, restart with "Pointer conditioning", independent of the one of the other maintenance functions that is executed. This is indicated in FIG. 3, as well as in FIGS. 5–7, by arrows 86.

With reference to FIG. 4, the mode 70 "Pointer conditioning" returns in step 88 each pointer x to the idle list 38, resets the value in the multiple pointer list 56 to "no multiple copies", and in the blocking list 62 to "no blocking". When the last pointer has been treated, cf. step 90, the pointer error counter is set to zero, step 92. The mode 70 thereupon ends in the mode 72, arrow 94.

The mode 72 "Quick test" is thus activated, with reference to FIG. 5, by the first mode 70 having been run through for all pointers. The initiation procedure is thereupon performed for all pointers and a simple write and read test on-line, step 96, is performed for buffer memory positions B(x) which have been identified by the pointer x. If found necessary, this test can be performed after queueing with low or lowest priority amongst the operations which can be performed on the buffer memory.

The result of the write and read test is used so as to return the current pointer to the idle list 38 if the test has given a correct result, but to block it from use in the system and introduce it into the blocking list 62 if the test indicates malfunction within the area identified by the pointer in question. After the last pointer the test passes into the mode 74, cf. step 98 and arrow 100.

Figure 2:
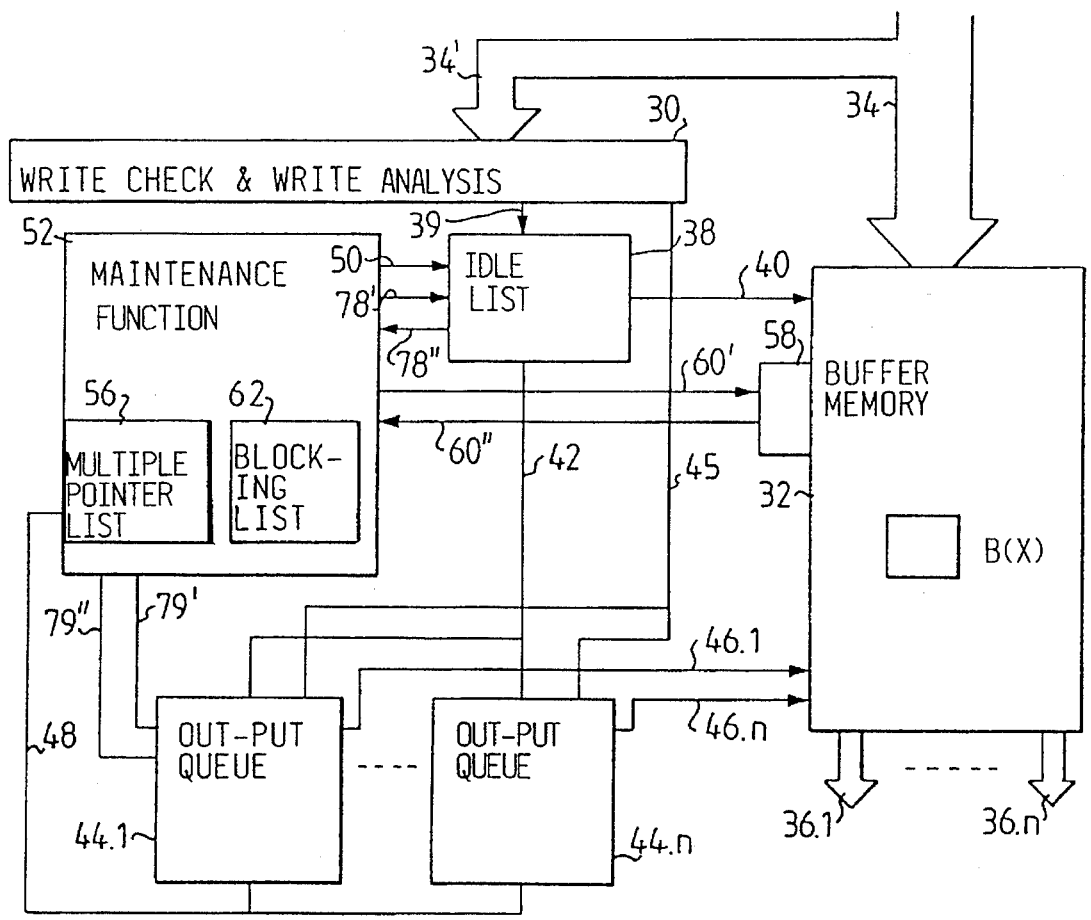

In contrast to the off-line test described earlier above, wherein the test logic 14 in FIG. 1 controls and checks all data and all addresses to the memory, the test logic 58 in FIG. 2 at the on-line test has only write and read rights to the address positions which have been released from system use by the initiation procedure, wherein the system is emptied of a pointer value. With respect to everything described henceforth, the test logic is forced to operate only when no higher priority system operations towards the memory come into question.

In the simple write and read test in the mode 72 according to FIG. 5 a first bit pattern is written into the address positions identified by the released pointer. As soon as this has been carried through these positions are read for testing that the memory cells are able to store this first bit pattern. Thereupon the course is repeated a second time, this time with a second bit pattern being the inverse of the first pattern. If read data do not correspond to the write data the signal 60" in FIG. 2 is generated in the form of an error signal.

The third operational mode 74 "Full test" is activated, referring to FIG. 6, by the second mode 72 having been gone through for all pointers and starts by performing the initiation procedure anew on the pointers not blocked by the mode 72. Thereupon a buffer memory test is queued for detecting types of malfunctions, which have not been detected by the simple write and read test in the second operational mode, with lowest priority to be performed on the buffer memory positions B(x) being non-blocked, cf. steps 102 and 104. These memory positions are exercised, i.e. written and read, with test data, whereas all other buffer memory positions being non-blocked are exercised, i.e. written and read, with system data during the test for each blocked pointer.

The result of the test is used so as to return the pointer to the idle list 38 if the buffer memory test has given a correct result, but to block it from being used in the system, and introduce it into the blocking list 62 if the buffer memory test indicates malfunction of the area identified by the pointer. After the last pointer the test proceeds to the mode 76, cf. step 106 and arrow 108.

In case of complete on-line test according to the third operational mode 74 also errors in the addressing logic shall be detected. Normally this requires that data different from the data in the memory position B(x) is written into all other addresses. According to the invention, system data is written into and read out from the other non-blocked positions. This fulfills the same function as the controlled data in the earlier described off-line test. The risk that an addressing error will escape discovery by the system happening to write the same data as the test logic uses for the test, in an address having an address decoding error overlapping memory positions under test, is minimized by continuously repeating all tests, and by one error detection being enough for blocking the pointer. Therefore the test logic awaits that system data have been written into all other used positions before the read check is performed.

The fourth operational mode 76 "Fulltest with retest" is thus activated, with reference to FIG. 7, by the fact that the third mode 74 has been run through for all pointers. Also the earlier blocked pointers are accepted thereupon for testing by said initiation procedure being performed cyclically for all pointers, one at a time. Thereupon a buffer memory test of the same kind as in the third mode is applied to non-blocked pointers, steps 110 and 112. Earlier blocked pointers are subjected to the same type of buffer memory test conditioned by each testing data operation being maintained in the queue as long as there is system data stored anywhere in the buffer memory segment containing the storing area B(x), which is identified by the earlier blocked pointer x, step 114. The result of the test is used in the same way as in the third mode for non-blocked pointers and not allowed tests of earlier blocked pointers, whereas earlier blocked pointers are returned to the idle list 38 not until having been accepted in a number of consecutive tests, said number being defined by a limit value β.

The fourth operational mode 76 is based on the understanding that in a continuous operation the risk must also be taken into consideration that addressing errors from the memory position under test may corrupt system data. Therefore no writing is allowed from the test logic in earlier blocked positions before the whole segment in which addressing errors may occur, has been emptied of system data. Thereafter writing with system data in all other positions is awaited, as in the third operational mode. Since all read operations may corrupt data in erroneous memories, emptying of system data from the memory segment is anew awaited before read check is performed on the buffer positions which are identified by the earlier blocked pointer, which is now under anewed test.

In one embodiment of the case one single operational mode, there is essentially the question of a merger of the two last operational modes according to FIGS. 6 and 7.

More particularly, a test of the buffer memory 32 is queued after the initiation procedure, with the lowest priority, for being performed on the buffer memory positions which are identified by non-blocked pointers, cf. steps 102 and 104 in FIG. 6. These memory positions are exercised with test data. All other non-blocked buffer memory positions are exercised with system data during the testing procedure. Thereafter the result of the test is used in a way that the pointer is returned to the idle list 38 if the buffer memory test has given a correct result, but is blocked from use in the system if the buffer memory test indicates malfunction in the area defined by the pointer.

Blocked pointers are supplied to the blocking list 62 and are subjected to the same type of buffer memory test conditioned by each testing data operation being maintained in the queue as long as system data are stored anywhere in the buffer memory segment containing the positions identified by blocked pointers, cf. step 114 in FIG. 7. Thereafter the result of the test is used so as to return the pointer to the idle list 38 if the buffer memory test has given a correct result. Blocked pointers are returned to the idle list 38 first after having been accepted in a number of consecutive tests, greater than the limit value $\beta$.

What is claimed is:

1. A queue system for buffering data in a packet switch with a common buffer memory for one or more output ports from the switch, said system using a number of pointers identifying storing positions in the buffer memory, and in which the pointers are moved between different logical lists for indicating the operation to be performed with the data in the buffer position pointed to, comprising a maintenance function which continuously secures that the system includes one and only one pointer to each valid packet position in the buffer memory;

wherein the maintenance function has a first operational mode which, after an initiation procedure, and activated by the fact that more than a determined limit number of lost or multiple pointers have been found as a result of said initiation procedure, or an outer signal, returns a copy of each pointer to an idle list, and indicates in a blocking list no blocking of pointers.

2. A queue system according to claim 1, wherein the maintenance function has a second operational mode activated by the first mode having been run through for all pointers, whereupon the initiation procedure is again performed on the pointers, a simple write and read test is queued for execution on buffer memory positions identified by pointers having a number of copies that does not agree with a value in a multiple pointer list, the result of the write and read test is used for returning the pointer in question to the idle list if the test has given a correct result, but blocking it out from use in the system if the test indicates malfunction within the area identified by the pointer in question.

3. A queue system according to claim 2, wherein the maintenance function has a third operational mode activated by the second mode having been run through for all pointers, whereupon the initiation procedure is once again executed on non-blocked pointers, a buffer memory test for detecting types of malfunctions having not been detected by the simple read and write test in the second operational mode is queued for execution on the buffer memory positions which have been identified by the initiated pointer, said memory positions being exercised with testing data, whereas all other, non-blocked buffer memory positions are exercised with system data during the test for each blocked pointer, the result of the test is used for returning the pointer to the idle list if the buffer memory test has given a first result, but blocking it out from use in the system if the buffer memory test has given a second result that indicates malfunction within the area identified by the pointer.

4. A queue system according to claim 3, the maintenance function has a fourth operational mode activated by the third mode having been run through for all pointers, whereupon also the earlier blocked pointers are accepted for testing by performing said initiation procedure cyclically for all pointers, one at a time, a buffer memory test of the same kind as in the third mode is applied on non-blocked pointers whereas earlier blocked pointers are exposed to the same type of buffer memory testing conditioned by each testing data operation being maintained in queue as long as system data is stored anywhere in the buffer memory segment containing the positions having been identified by the earlier blocked pointer in question, the result of the testing is used in the same way as in the third mode for non-blocked pointers and non accepted tests of earlier blocked pointers, whereas earlier blocked pointers are returned to the idle list first after having been accepted in a number of consecutive tests defined by a limit number.

5. A queue system for buffering data in a packet switch with a common buffer memory for one or more output ports from the switch, said system using a number of pointers identifying storing positions in the buffer memory, and in which the pointers are moved between different logical lists for indicating the operation to be performed with the data in the buffer position pointed to, wherein copies of the same pointer are handled in a controlled way by using a multiple pointer list where the number of copies included in the system of respective pointers are recorded, and in which a maintenance function checks that the number of copies of a pointer agrees with the value recorded in the multiple pointer list for the respective pointer.

6. A queue system according to claim 5, wherein besides the multiple pointer list the following logical lists for the respective pointer categories are used: an idle list for idle pointers, output queue lists for queued pointers in a queue to output ports, and a blocking list for blocked pointers.

7. A queue system according to claim 6, wherein the maintenance function cyclically checks all pointers and appurtenant buffer positions, one at the time, preceded by an initiation procedure during which the pointer is taken out of operation by filtering out the pointer from the flow of pointers, which from the output queue lists are returned to the idle list, until the queue system has been emptied of each copy of the pointer in question, whereupon the number of returned copies of the pointer in question is compared with the value in the multiple pointer list.

8. A queue system according to claim 7, wherein the maintenance function has a first operational mode which, after the initiation procedure, and activated by more than a determined limit number of pointers having been found as a result of said initiation procedure, the respective number of copies of which does not agree with the value in the multiple pointer list for the pointer in question, or an external signal, returns the pointers to the idle list, resets the value in the multiple pointer list to no multiple copies, and in the blocking list indicates no blocking of pointers.

9. A queue system according to claim 8, wherein the maintenance function has only one further operational mode.

10. A queue system according to claim 9, wherein the maintenance function has a second operational mode activated by the first maintenance mode having been run through for all pointers, whereupon the initiation procedure is again performed on each pointer, one at a time, and a buffer memory test is queued with low priority on non-blocked memory positions identified by the pointer in question, whereas all other non-blocked memory positions are exercised with system data during the test, and in which the result of the memory test is used for returning the pointer to the idle list if the buffer memory test has given a correct result, but is blocked from use in the system if the buffer memory test indicates malfunction of the area defined by the pointer, the blocked pointers are exposed to a second buffer memory testing of the same type as the first one conditioned by each testing data operation being maintained in the queue as long as system data is stored anywhere in the buffer memory segment including the positions which have been identified by blocked pointers, the result of the second test is used for returning the pointer to the idle list if the test has given a correct result, whereas blocked pointers are returned to the idle list first after having been accepted in a number of consecutive tests exceeding a second limit number.

11. A queue system according to claim 7, wherein the maintenance function has a first operational mode which, after the initiation procedure, and activated by the fact that more than a determined limit number of lost or multiple pointers have been found as a result of said initiation procedure, or an outer signal, returns a copy of each pointer to the idle list, and in the blocking list indicates no blocking of pointers.

12. A queue system according to claim 6, wherein the maintenance function has a number of different operational modes.

13. A queue system according to claim 8, wherein the lists for multiple used and blocked pointers are combined into one list.

14. In a queue system for buffering data in a packet switch with a common buffer memory for one or more output ports from the switch, said system using a number of pointers identifying storing positions in the buffer memory, and in which the pointers are moved between different logical lists for indicating the operation to be performed with the data in the buffer position pointed to, a method for managing said pointers, comprising continuously securing that the system includes one and only one pointer to each valid packet position in the buffer memory, exposing all pointers to an initiation procedure by taking every pointer out of operation by filtering it out from the flow of pointers, which are returned to an idle list from output queue lists for queued pointers in a queue to output ports, until the queue system has been emptied of every copy of the pointer in question, and comparing the number of returned copies of the pointer in question with the value in a multiple pointer list, performing after said initiation procedure a first operational mode which activated by either the fact that more than a determined limit number of lost or multiple pointers have been found as a result of said initiation procedure, or an external signal, comprises the steps of returning a copy of each pointer to the idle list, and indicating in a blocking list no blocking of pointers.

15. A method according to claim 14, comprising performing a second operational mode activated by the first mode having been run through for all pointers, and including the steps of performing the initiation procedure again on the pointers, queuing a simple write and read test for execution on buffer memory positions identified by pointers having a number of copies that does not agree with a value in the multiple pointer list, using the result of the write and read test for returning the pointer in question to the idle list if the test has given a correct result, but blocking it out from use in the system if the test indicates malfunction within the area identified by the pointer in question.

16. A method according to claim 15, comprising performing a third operational mode activated by the second mode having been run through for all pointers, performing the initiation procedure once again on the non-blocked pointers, queuing a buffer memory test for detecting types of malfunctions having not been detected by the simple write and read test in the second operational mode for execution on the buffer memory positions which have been identified by the initiated pointer, said buffer memory test including the steps of exercising these memory positions with testing data, and exercising all other non-blocked buffer memory positions with system data during the test for each blocked pointer, using the result of the test for returning the pointer to the idle list if the buffer memory test has given a first result, but blocking it out from use in the system if the buffer memory test has given a second result that indicates malfunction in the area identified by the pointer.

17. A method according to claim 16, comprising performing a fourth operational mode activated by the third mode having been run through for all pointers, and including the steps of accepting also the earlier blocked pointers for testing by performing said initiation procedure cyclically for all pointers, one at a time, applying a buffer memory test of the same kind as in the third mode on non-blocked pointers, and exposing earlier blocked pointers to the same type of buffer memory testing conditioned by each testing data operation being maintained in queue as long as system data is stored anywhere in the buffer memory segment containing the positions having been identified by the earlier blocked pointer in question, using the result of the test in the same way as in the third mode for non-blocked pointers and non-accepted tests of earlier blocked pointers, and returning earlier blocked pointers to the idle list first after having been accepted in a number of consecutive tests defined by a limit number.

18. In a queue system for buffering data in a packet switch with a common buffer memory for one or more output ports from the switch, said system using a number of pointers identifying storing positions in the buffer memory, and in which the pointers are moved between different logical lists for indicating the operation to be performed with the data in the buffer position pointed to, a method for managing said pointers, comprising handling copies of the same pointer in a controlled manner by recording in a multiple pointer list the number of copies included in the system of respective pointers, and checking that the number of copies of a pointer agrees with the value recorded in the multiple pointer list for the respective pointer.

19. A method according to claim 18, comprising using besides the multiple pointer list the following logical lists for the respective pointer categories: an idle list for idle pointers, output queue lists for queued pointers in a queue to output ports, and a blocking list for blocked pointers.

20. A method according to claim 19, comprising a) exposing all pointers to an initiation procedure by taking every pointer out of operation by filtering it out from the flow of pointers, which from the output queue lists are returned to the idle list, until the queue system has been emptied of every copy of the pointer in question, and comparing the number of returned copies of the pointer in question with the value in the multiple pointer list, and, after said initiation procedure, b) cyclically checking all pointers and positions in the buffer memory identified by the pointers, one at a time.

21. A method according to claim 20, comprising performing after said initiation procedure a first operational mode which activated by either the fact that more than a determined limit number of pointers have been found as a result of said initiation procedure, the respective number of copies of which does not agree with the value in the multiple pointer list for the pointer in question, or an external signal, comprises the steps of returning the pointers to the idle list, resetting the value in the multiple pointer list to no multiple copies, and in the blocking list indicating no blocking of pointers.

22. A method according to claim 20, comprising performing after said initiation procedure a first operational mode which, activated by either the fact that more than a determined limit number of lost or multiple pointers have been found as a result of said initiation procedure, or an external signal, comprises the steps of returning a copy of each pointer to the idle list, and in the blocking list indicating no blocking of pointers.

23. A method according to claim 21, comprising performing a second operational mode activated by the first maintenance mode having been run through for all pointers, and including the steps of performing the initiation procedure again on each pointer, one at a time, queueing a buffer memory test with low priority on non-blocked memory positions identified by the pointer in question, exercising all other non-blocked memory positions with system data during the test, and using the result of the memory test for returning the pointer to the idle list if the buffer memory test has given a correct result, but blocking it from use in the system if the buffer memory test indicates malfunction of the area defined by the pointer, exposing the blocked pointers to a second buffer memory test of the same type as the first one, conditioned by maintaining each testing data operation in the queue as long as system data is stored anywhere in the buffer memory segment including the positions which have been identified by blocked pointers, using the result of the second test for returning the pointer to the idle list if the test has given a correct result, and returning blocked pointers to the idle list first after having been accepted in a number of consecutive tests exceeding a second limit number.

* * * * *